(12) United States Patent
Park et al.

(10) Patent No.: US 7,105,887 B2
(45) Date of Patent: Sep. 12, 2006

(54) MEMORY CELL STRUCTURES INCLUDING A GAP FILLING LAYER AND METHODS OF FABRICATING THE SAME

(75) Inventors: Hyuk Park, Gyeonggi-do (KR); Bong Kil Kim, Gyeonggi-do (KR)

(73) Assignee: Dongbu Electronics, Co., Ltd., Seoul (KR)

( * ) Notice: Subject to any disclaimer, the term of this patent is extended or adjusted under 35 U.S.C. 154(b) by 0 days.

(21) Appl. No.: 10/747,600

(22) Filed: Dec. 29, 2003

(65) Prior Publication Data
US 2004/0142530 A1    Jul. 22, 2004

(30) Foreign Application Priority Data
Dec. 30, 2002    (KR)    ........................ 10-2002-0087356

(51) Int. Cl.
*H01L 29/788* (2006.01)
(52) U.S. Cl. .................... 257/315; 438/257
(58) Field of Classification Search ................ 438/230, 438/257, 593–595, 366; 257/315–317, 319–321
See application file for complete search history.

(56) References Cited

U.S. PATENT DOCUMENTS

| 5,514,900 | A | * | 5/1996 | Iranmanesh | .................. 257/530 |
| 5,970,335 | A |   | 10/1999 | Helm et al. | .................. 438/232 |
| 6,475,895 | B1 |   | 11/2002 | Mei et al. | .................. 438/597 |
| 6,624,024 | B1 | * | 9/2003 | Prall et al. | .................. 438/257 |

* cited by examiner

*Primary Examiner*—David Vu
(74) *Attorney, Agent, or Firm*—Saliwanchik, Lloyd & Saliwanchik

(57) ABSTRACT

Memory cell structures and methods of fabricating the same are disclosed. An illustrated fabrication method comprises: forming spacers to isolate and protect a gate area (including a floating gate and a control gate); forming a gap filling layer over a substrate including the gate area and the spacers; and depositing an insulating layer over the gate area and the gap filling layer. The spacers may be formed of SiN. The gap filling layer may be formed by depositing undoped polysilicon or amorphous silicon over the gate area and the spacers, and by performing an anisotropic etching of the undoped polysilicon or amorphous silicon.

8 Claims, 3 Drawing Sheets

MEMORY CELL STRUCTURES INCLUDING A GAP FILLING LAYER AND METHODS OF FABRICATING THE SAME

FIELD OF THE DISCLOSURE

This disclosure relates to a method of fabricating an embedded flash memory and, more particularly, to a method of fabricating a flash memory cell, which can effectively prevent the formation of voids in a gap between spacers for a gate constituting a transistor of a flash memory cell.

BACKGROUND

Non-volatile memory devices such as EEPROMs or flash EEPROMs comprise memory cells including a floating gate which stores data and a control gate which applies voltage to the floating gate. The memory cells are formed on a semiconductor substrate including source/drain regions.

FIGS. 1a and 1b are cross-sectional views of a prior art flash memory cell during fabrication.

Referring to FIG. 1a, an N-well 12 and a P-well 13 are formed in a silicon substrate 11. The N-well 12 and/or the P-well 13 may be formed, for example, by ion implantation. A source/drain region 14 is defined in the P-well 13 by, for example, ion implantation. A gate oxide 15, a floating gate 17, an oxide-nitride-oxide (ONO) layer 18, and a control gate 19 are then formed by ion implantation, photoresist coating, patterning, development, deposition, etc. The floating gate 17 stores electric charges and the control gate 19 is used to apply voltage to the floating gate 17. The floating gate 17 and the control gate 19 are formed into a tandem structure. Spacers 20 of SiN are formed to isolate and protect the gate area including the floating gate 17 and the control gate 19. A source/drain region 14 is defined in the upper part of the P-well 13, and positioned between adjacent gate spacers 20 of adjacent gate areas. A unit block of a transistor consists of the floating gate 17, the control gate 19, and the source/drain region 14. In addition, silicide 16 and a borderless contact (BLC) layer 21 are formed to connect the flash memory cell to an external terminal such as a word line or a bit line.

Referring to FIG. 1b, after the formation of the spacers 20, borophosphorsilicate glass (BPSG) 22 is deposited over the substrate. Generally, in order to ensure the characteristics of the logic transistors and to reduce the costs in fabricating an embedded flash memory, a SiN layer is deposited and etched to form the spacers 20. The BPSG layer 22 is then deposited over the gate structure to form a passivation layer of the flash memory cell.

However, because the gap between the SiN spacers is very narrow in a cell array, if the BPSG layer 22 is deposited after formation of the spacers 20, voids 23 are formed in the gap between the SiN spacers 20. The voids 23 may change the characteristics of each cell. In addition, the size of the voids 23 vary according to a critical dimension of polysilicon constituting each cell. This variation in the sizes of the voids may also change characteristics of the cells. For example, the voids function as parasitic capacitances which decrease the operating speed of the flash memory device and function as points of stress and leakage during device operation, thereby causing deterioration of device reliability and characteristics.

To obviate the problems due to voids formed in the passivation layer in fabricating a non-volatile memory device, Mei et al., U.S. Pat. No. 6,475,895, describes a semiconductor device having a passivation layer and a method for its fabrication. This U.S. patent provides a final passivation layer, especially for flash memory and other non-volatile memory technologies, that can overcome problems due to a narrow gap between metal lines which cannot be completely filled by using the conventional film deposition techniques of chemical vapor deposition (CVD) or plasma enhanced chemical vapor deposition (PECVD). A semiconductor device structure described in the above-mentioned U.S. patent includes a first layer of high density plasma (HDP) oxide and an overlying layer of silicon oxynitride. Application of the HDP oxide to a pattern of metal structures fills gaps between the metal structures and allows for the void free deposition of the silicon oxynitride layer. The silicon oxynitride layer provides a hard outer coating to the passivation coating.

DETAILED DESCRIPTION

Figure 1A:
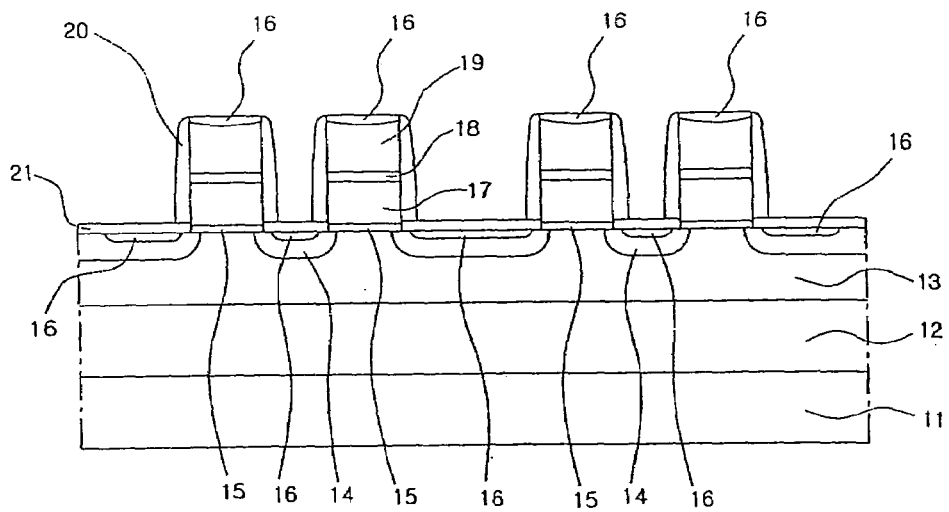
FIGS. 1a and 1b are cross-sectional views of a prior art flash memory structure during the fabrication process.
Figure 1B:
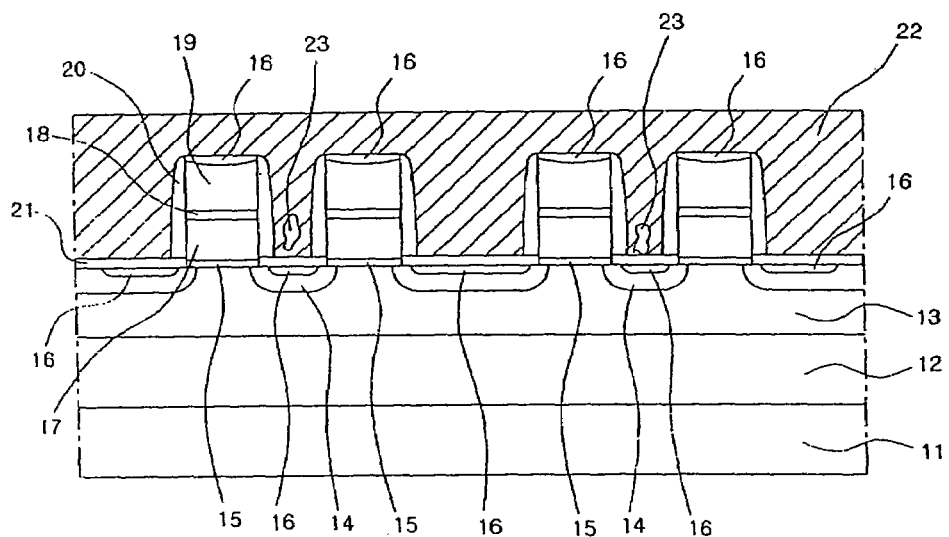
Figure 2A:
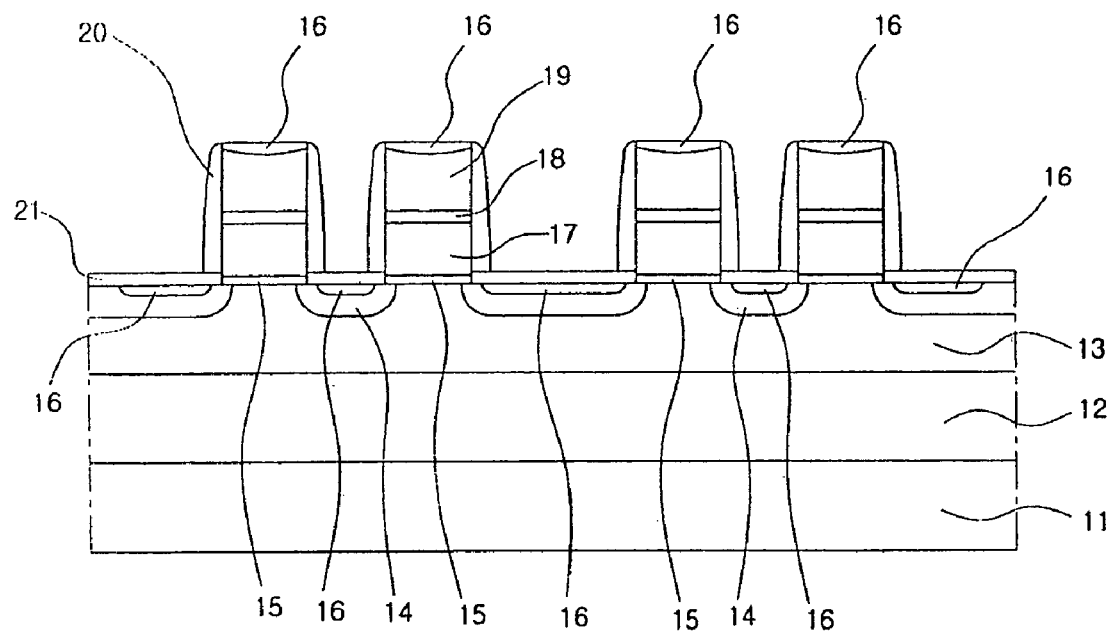
FIGS. 2a through 2d are cross-sectional views of an example flash memory during an example fabrication process in accordance with the teachings of the present disclosure.

Referring to FIG. 2a, an N-well 12 and a P-well 13 are formed in a silicon substrate 11. The wells 12, 13 may be formed, for example, by ion implantation. A source/drain region 14 is defined in the silicon substrate 11, for example, by ion implantation. Then, a gate oxide 15, a floating gate 17 which stores electric charges, an ONO layer 18, and a control gate 19 to apply voltage to the floating gate 17 are sequentially formed on the substrate 11 through photoresist coating, mask patterning, development, and deposition processes. Silicide 16 including a conductive metal element and a BLC layer 21 are then formed. The silicide 16 and the BLC layer 21 may be connected to an external terminal such as a word line or a bit line. Next, a SiN layer is deposited and etched to form spacers 20 in order to isolate and protect the gate areas (a gate area includes, for example, a floating gate 17 and a control gate 19).

Figure 2B:
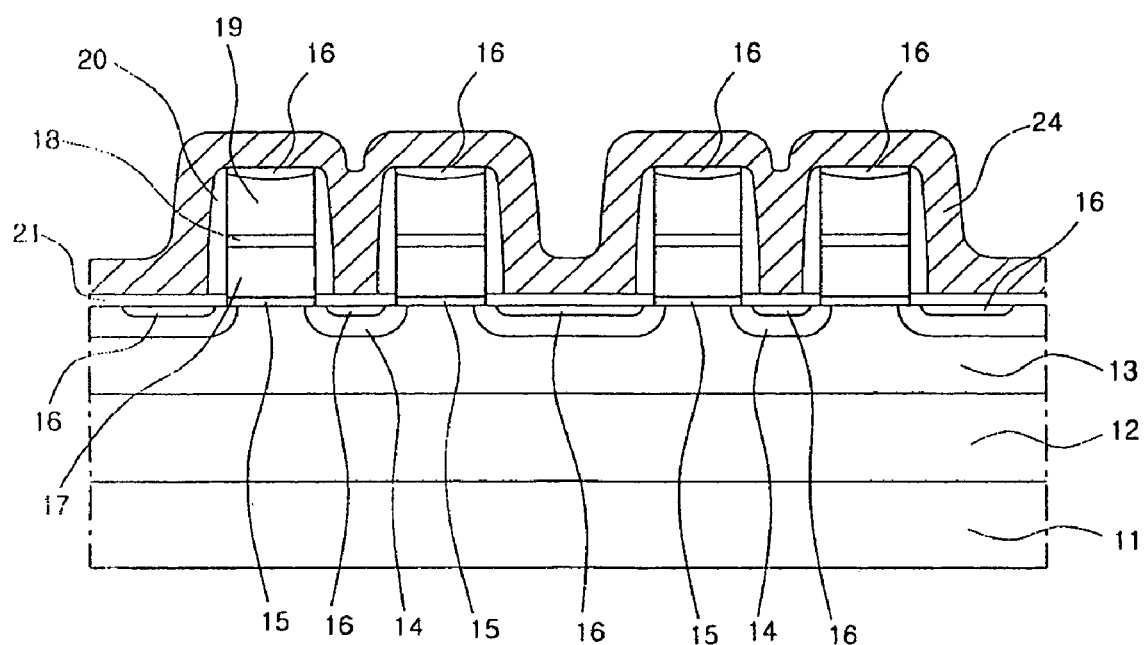

Referring to FIG. 2b, a filling layer 24 is deposited over the gate areas and the spacers 20. Undoped polysilicon or amorphous silicon is used to form the filling layer 24. Narrow gaps between the spacers 20 can be easily filled up without voids being created because both undoped polysilicon and amorphous silicon have an excellent gap filling characteristics.

Figure 2C:
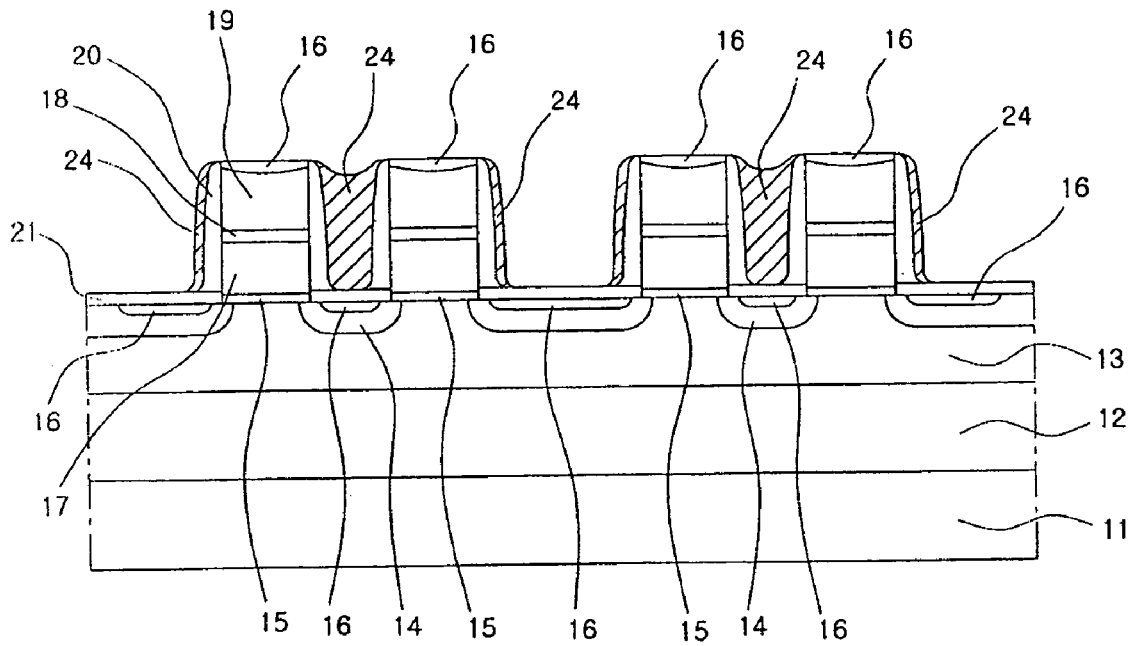

Referring to FIG. 2c, the filling layer 24 is etched. The etching of the sidewalls of the spacers 20 is restricted because of a high etching selectivity of the undoped polysilicon or the amorphous silicon with the SiN of the spacers 20. Therefore, if an anisotropic etching method with good selectivity is performed, the undoped polysilicon or the amorphous silicon, which fills the gaps between the spacers 20, remains without being removed by the etching process. The etching solution used to etch the undoped polysilicon or the amorphous silicon is preferably $HNO_3+CH_3COOH+HF$.

Figure 2D:
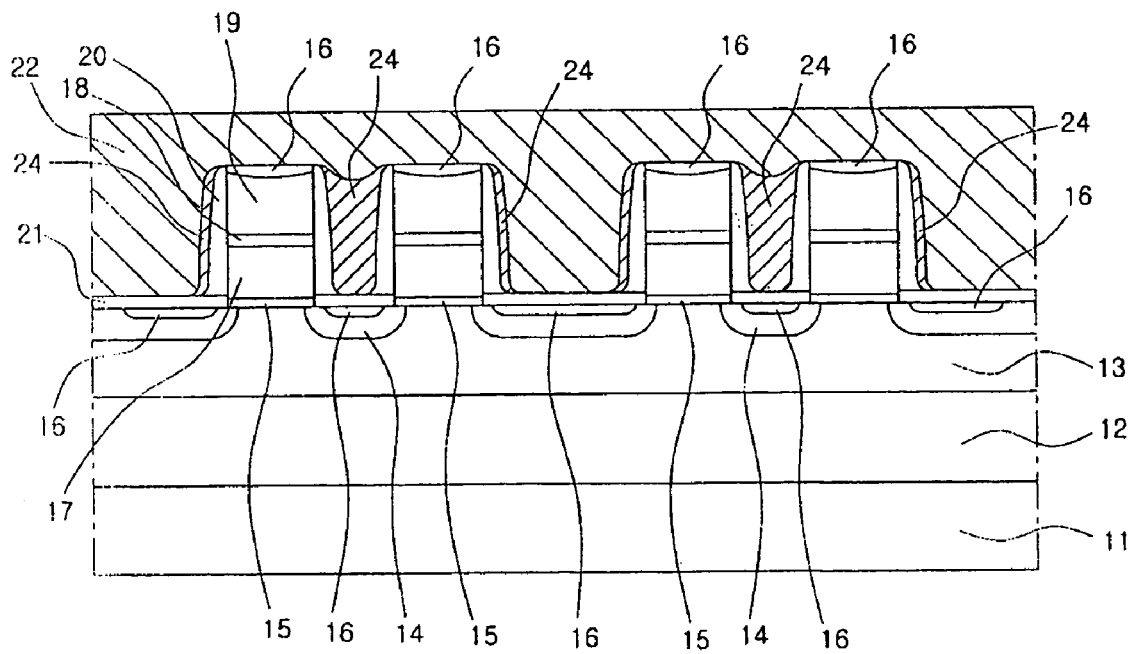

Referring to FIG. 2d, a BPSG layer 22 is deposited over the BLC layer 21, the upper silicide 16 on the gate areas, and the etched filling layer 24. Consequently, as shown in FIG. 2d, the gaps between the gate areas are completely filled with the filling layer 24 without any voids.

After formation of the BPSG layer 22, metal contact lines are formed in order to connect the flash memory cell to external terminals. The contacts between the metal contact lines on the silicide 16 are established for connection.

As described in the above, the illustrated method can effectively prevent the formation of voids in the gaps between gate spacers of adjacent gate areas during the deposition of a BPSG layer in fabricating an embedded flash memory cell. Accordingly, the illustrated method can obviate the effects of voids on cell characteristics and ensure stable operation of the memory device.

From the foregoing, persons of ordinary skill in the art will appreciate that the above disclosed method prevents changes of cell characteristics due to voids by obviating the formation of voids in gaps between gate spacers in the deposition of BPSG. In particular, the illustrated method of fabricating a flash memory cell comprises: forming spacers to isolate and protect a gate area; depositing undoped polysilicon; etching the polysilicon by an anisotropic etching; and depositing BPSG.

Although certain example methods and apparatus have been described herein, the scope of coverage of this patent is not limited thereto. On the contrary, this patent covers all methods, apparatus and articles of manufacture fairly falling within the scope of the appended claims either literally or under the doctrine of equivalents.

What is claimed is:

1. A method of fabricating a memory cell comprising:
   forming spacers to isolate and protect a gate area including a floating gate and a control gate;
   forming a gap filling layer over a substrate including the gate area and the spacers, wherein the gap filling layer is formed by depositing undoped polysilicon or amorphous silicon, wherein the gap filling layer fills a narrow gap between adjacent gate areas without any voids;
   performing an anisotropic etching of the gap filling layer, wherein the gap filling layer remains in the narrow gap without being substantially removed by the anisotropic etching; and
   depositing an insulating layer over the gate area and the gap filling layer.

2. A method as defined in claim 1, wherein the spacers are formed by depositing and etching a SiN layer.

3. A method as defined in claim 1, wherein the insulating layer is formed of TEOS (tetra ethyl ortho silicate) or BPSG (borophosphorsilicate glass).

4. A method as defined in claim 1, wherein performing an anisotropic etching of the gap filling layer etches a predetermined part of the gap filling layer to expose a surface of the substrate.

5. A memory cell structure comprising:
   a substrate including N-well, P-well, and source/drain region;
   a plurality of gate areas formed on the substrate, the gate areas including a gate oxide, a floating gate, an insulating layer, and a control gate;
   spacers on sidewalls of the gate areas;
   a gap filling layer formed without any voids in narrow gaps between areas adjacent gate areas; and
   an insulating layer deposited over the gate areas, the gap filling layer, and an exposed surface of the substrate, wherein the gap filling layer is formed of undoped polysilicon or amorphous silicon.

6. A memory cell structure as defined in claim 5, wherein the spacers are formed of SiN.

7. A memory cell structure as defined in claim 5, wherein the gap filling layer is formed by an anisotropic etching.

8. A memory cell structure as defined in claim 5, wherein the narrow gaps between adjacent gate areas are located above the source/drain region in the substrate.

* * * * *